United States Patent [19]

Miyazaki et al.

[11] Patent Number: 5,131,842
[45] Date of Patent: Jul. 21, 1992

[54] CORROSION RESISTANT THERMAL TREATING APPARATUS

[75] Inventors: Shinji Miyazaki, Yokohama; Katushin Miyagi, Sagamihara; Mituaki Komino, Tokyo, all of Japan

[73] Assignees: Kabushiki Kaisha Toshiba, Kawasaki; Tokyo Electron Sagami Limited, Kanagawa, both of Japan

[21] Appl. No.: 543,491

[22] Filed: Jun. 26, 1990

[51] Int. Cl.5 ............... F27D 3/12; F27D 5/00; H05B 3/62; C23C 16/00
[52] U.S. Cl. .......................... 432/241; 432/5; 432/6; 432/11; 432/253; 118/715; 118/725
[58] Field of Search ............... 432/5, 6, 11, 241, 253; 118/715, 725

[56] References Cited

U.S. PATENT DOCUMENTS

| | | | |
|---|---|---|---|
| 4,753,192 | 6/1988 | Goldsmith et al. | 118/715 X |
| 4,767,251 | 8/1988 | Whang | 432/11 X |
| 4,793,283 | 12/1988 | Sarkozy | 118/715 |
| 4,911,638 | 3/1990 | Bayne et al. | 432/11 X |
| 4,950,156 | 8/1990 | Philipossian | 432/253 |
| 4,950,870 | 8/1990 | Mitsuhashi et al. | 219/411 X |
| 4,954,684 | 9/1990 | Aoki et al. | 219/411 X |
| 4,989,540 | 2/1991 | Fuse et al. | 118/725 X |
| 4,998,879 | 3/1991 | Foster et al. | 432/253 |
| 5,000,682 | 3/1991 | Heidt et al. | 432/241 |

Primary Examiner—Henry A. Bennet
Assistant Examiner—Christopher B. Kilner
Attorney, Agent, or Firm—Oblon, Spivak, McClelland, Maier & Neustadt

[57] ABSTRACT

A thermal treating apparatus includes a reaction tube having an opening end and storing an object to be treated, an annular manifold arranged at the opening end and having an inlet for supplying a gas to the reaction tube and an outlet for exhausting the gas from the reaction tube, and a cover arranged on the opening end of the manifold. The surfaces of the annular manifold and the cover exposed to the inside of the reaction tube are covered by a material which is not corroded by the gas supplied to the reaction tube.

10 Claims, 2 Drawing Sheets

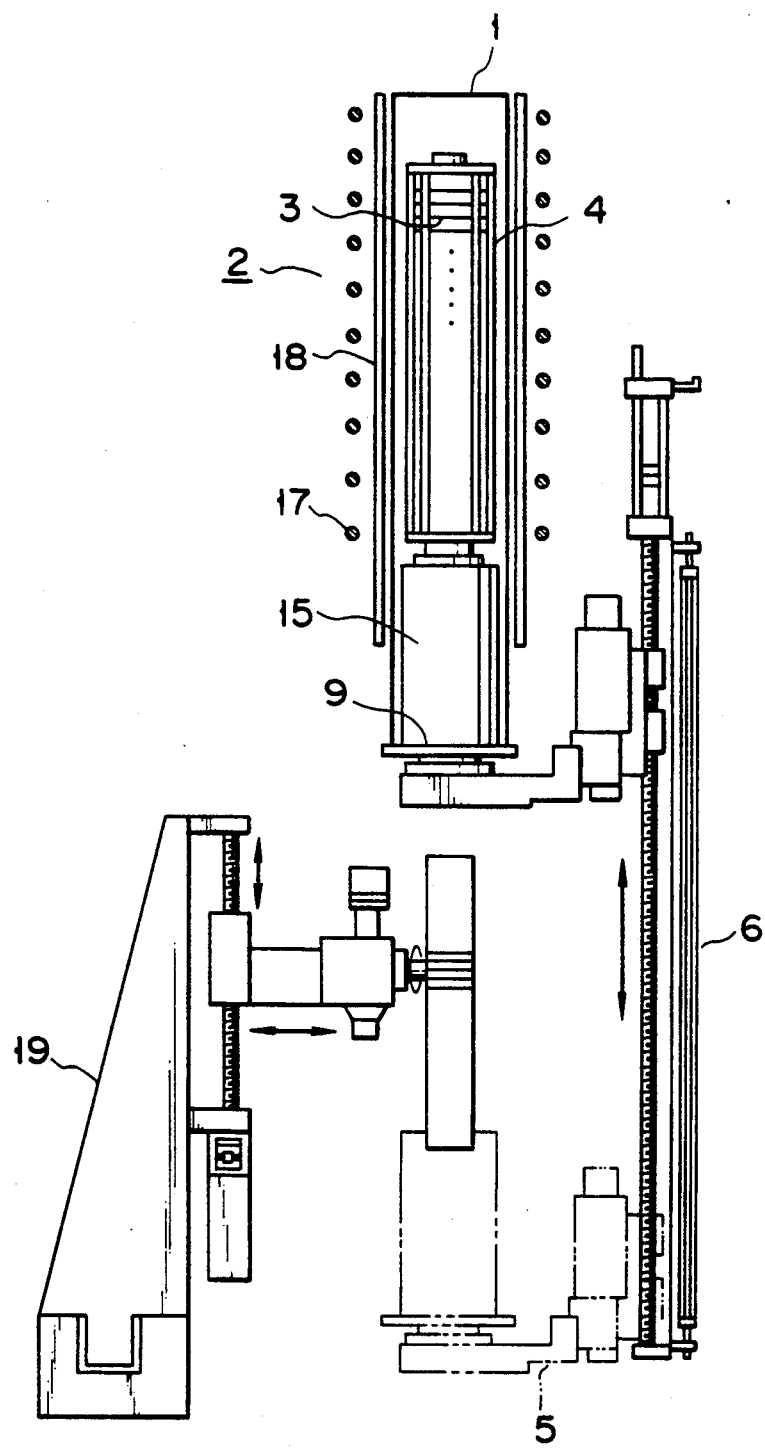
F I G. 1

CORROSION RESISTANT THERMAL TREATING APPARATUS

BACKGROUND OF THE INVENTION

1. Field of the Invention

The present invention relates to a thermal treating apparatus, and more particularly, to a thermal treating apparatus for a semiconductor wafer.

2. Description of the Related Art

In thermal treating steps such as an oxidizing step, a diffusion step, a CVD (chemical vapor deposition) step for an object to be treated, e.g., a semiconductor wafer, a thermal treating apparatus comprising a reaction tube is used. The thermal treating apparatus is operated in the following manner. That is, a boat on which a plurality of semiconductor wafers are stacked is inserted in an opening end of a reaction tube made of quartz glass and wound by a heating wire, the boat is set at a predetermined position in the reaction tube, and the opening end is sealed by a cover plate through a manifold. In this case, the manifold is a ring-like member having a plurality of nozzle ports for supplying plural types of gases in the reaction tube. While the wafer is annealed by heat generated from the heating wire, a predetermined reaction gas is supplied to treat described in Published Examined Japanese Patent the wafers. This thermal treatment technique is Application No. 60-4148 and the Published Unexamined Japanese Patent Application No. 60-119716.

In the thermal treatment technique, in order to prevent the wafer from contamination by a heavy metal, the reaction tube is made of quartz glass. In an etching apparatus disclosed in Published Examined Japanese Patent Application Nos. 57-52423 and 63-41986, an etching chamber is made of $SiO_2$, $Si_3N_4$ or $Al_2O_3$.

In a thermal treatment such as CVD, since a reactive gas toxic to human is used, leakage of the reactive gas from the reaction tube must be prevented. For this reason, the opening end of the reaction tube is sealed by a manifold and a cover plate made of stainless steel having an excellent machining precision to obtain airtightness of the reaction tube.

In the reaction tube, an opening end of which is sealed by the manifold and cover plate made of stainless steel, however, when a thermal treatment such as CVD is performed at a high temperature of 400° to 1,400° C., heavy metals such as Fe (iron) are scattered from the manifold and the cove plate and attached to the wafer surface to contaminate the wafer.

When a silicon layer is to be formed on the wafer surface, an $SiH_2Cl_2$ (diclorosilane) gas used as a raw gas is supplied in the reaction tube and dissolved by a plasma to produce Si and HCl, thereby depositing this Si on the wafer. At this time, the manifold and the cover plate made of stainless steel are oxidized by this HCl. In this oxidization, since particles are generated in the reaction tube, the inside of the reaction tube and the wafer are contaminated.

SUMMARY OF THE INVENTION

It is an object of the present invention to provide a thermal treating apparatus for preventing contamination of a reaction tube.

According to the present invention, there is provided a thermal treating apparatus comprising a reaction tube having an opening end and storing an object to be treated, an annular manifold means arranged at the opening end and having an inlet means for supplying a gas to the reaction tube and an outlet means for exhausting the gas from the reaction tube, and a cover means arranged at an opening end of the manifold means, wherein surfaces of the annular manifold means and the cover means exposed to the inside of the reaction tube are covered by a material which is not corroded by the gas supplied to the reaction tube.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 is a view showing an arrangement of a CVD apparatus according to one embodiment of the present invention.

DETAILED DESCRIPTION OF THE PREFERRED EMBODIMENT

Figure 2:
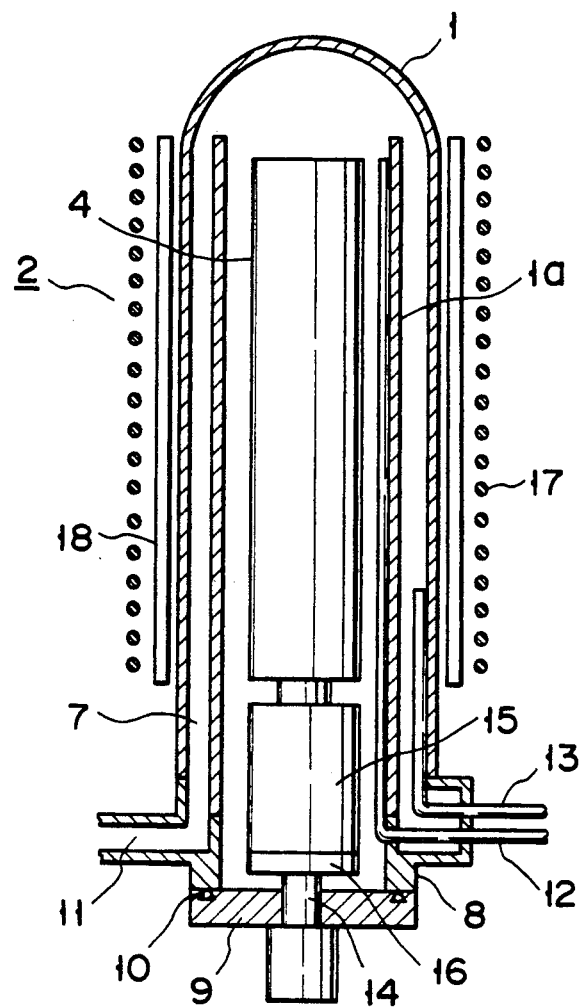
FIG. 2 is a view showing a treatment section as a part of the CVD apparatus in FIG. 1.

An embodiment wherein the present invention is applied to a CVD apparatus will be described below with reference to the accompanying drawings.

FIG. 1 is a view showing an arrangement of a vertical CVD apparatus according to one embodiment of the present invention. FIG. 2 is an expanded view showing a treatment section consisting of a lower part of the vertical apparatus shown in FIG. 1, and also including elements 7, 8 and 10-15 which are not shown in FIG. 1. The vertical CVD apparatus comprises a treatment section 2 having a reaction tube 1, a boat 4 on which a plurality of, e.g., 100 to 150, semiconductor wafers 3 are vertically stacked at a predetermined interval, and a transferring mechanism 6 for loading/unloading the boat 4 from a predetermined transferring position 5 below the reaction tube 1 in/from the reaction tube 1.

The reaction tube 1 is heat-resistant and is made of a non-metallic material such as quartz glass which is difficult to be reacted with a reactive gas. As shown in FIG. 2, the reaction tube 1 has a cylindrical structure, upper end of which is closed. A cylindrical inner tube 1a which is made of a non-metallic material like the reaction tube 1 is concentrically arranged not to contact the reaction tube 1.

A predetermined gap 7 (shown in FIG. 2) is held between the reaction tube 1 and the inner tube 1a, and the lower end of the gap 7 is sealed by a cylindrical manifold 8(shown in FIG. 2). The cylindrical manifold 8 is made of stainless steel, and the surface thereof exposed to a reactive gas in the reaction tube 1 is coated with ceramics. A cover plate 9 (shown in FIG. 2) is arranged on the lower end of the cylindrical manifold 8. The cover plate 9 is vertically moved by the transferring mechanism 6 and brought into contact with or separated from the lower end of the cylindrical manifold 8. The cover plate 9 is also made of stainless steel, and the surface thereof exposed to the reaction tube 1 is coated with ceramics.

A sealing member such as an O-ring is arranged in an O-ring groove 10 (shown in FIG. 2) at the contact portion between the cover plate 9 and the manifold 8, thereby maintaining air-tightness in the reaction tube 1.

A exhaust tube 11 (shown in FIG. 2) attached to the cylindrical manifold 8, thereby exhausting a gas from the reaction tube 1 through the gap 7. A reactive gas supplying tube 12 (shown in FIG. 2) is attach to the cylindrical manifold 8. The reactive gas supplying tube 12 extends inside the inner tube 1a and extend perpendicularly along the inner surface of the inner tube 1a, and its distal end has a level almost equal to that of the upper surface of the boat 4. A plurality of openings (not shown) are formed in the reactive gas supplying tube 12 at positions corresponding to the wafers 3, and a reactive gas can be supplied from the openings to, the wafers 3.

An inert gas supplying tube 13 (shown in FIG. 2) is attached to the cylindrical manifold 8 such that an inert gas such as an $N_2$ gas can be supplied to the reaction tube 1 through the gap 7.

A supporting member 14(shown in FIG. 2), a surface of which is covered with a non-metallic material such as quartz glass, is arranged at the center of the cover plate 9. Note that the cylindrical manifold 8 has a jacket, and cooling water is supplied through the jacket, thereby cooling the manifold 8 with water.

An insulating cylinder 15 (shown in FIG. 2) made of a non-metallic material such as quartz glass is arranged at the lower end of the boat 4. The insulating cylinder 15 is arranged to prevent downward conduction of heat from the reaction tube 1. That is, since the manifold 8 is water-cooled as described above, the inside of the reaction tube 1 is cooled. However, when the temperature of the inner surface of the reaction tube 1 is lower than 130° C., powder of $NH_4Cl$ is formed on the surface of the mainfold 8 to generate foreign particles. For this reason, the insulating cylinder is arranged to keep the inside of the reaction tube 1 at the desired temperature and to hold the surface of the mainfold 8 at the optimal temperature.

An insulating cylinder supporting bed 16 made of a non-metallic material such as ceramics is disposed on the lower surface of the insulating cylinder 15. The insulating cylinder 15 and the boat 4 are supported by the insulating cylinder supporting bed 16 and the supporting member 14. The cover plate 9 is connected to the transferring mechanism 6, and the insulating cylinder 15 and boat 4 are vertically moved by the operation of the transferring mechanism 6.

A cylindrical heating means such as a heater 17 is formed around the reaction tube 1 to be coaxial with the reaction tube 1. In the reaction tube 1, a region on which the wafer 3 is stacked is heated to a temperature of 400° to 1,400° C. Note that, in order to perform this heating in a uniform temperature distribution, a soaking tube 18 made of, e.g., silicon carbide (SiC) is arranged between the heater 17 and the reaction tube 1.

As ceramic materials coated on the portions of the cylindrical manifold 8 and the cove plate 9 exposed in an atmosphere in the reaction tube 1, alumina, magnesia, spinel ($Al_2O_3$ MgO), silica, SiC, $Si_3N_4$, amorphous silicon, or the like can be employed. It is especially better that alumina, magnesia, or the like is applied by flame spraying. In this case, it is particularly preferable that a buffer layer having a thermal expansion coefficient as an intermediate value between those of the ceramic coating and a substrate is formed between the ceramic coating and the substrate to prevent the ceramic coating from peeling from the substrate due to a difference between their thermal expansion coefficients. In addition, as the buffer layer, an Ni-based material (METCO 700, 700F: trade name) is flame-sprayed to obtain a good result.

An operation of the CVD apparatus with the above arrangement will be described below.

The large number of wafers 3 are stacked on the boat 4 by a wafer transferring apparatus (not shown), and the boat 4 is held and conveyed by a handler 19 and placed on the insulating cylinder 15 located at a transferring position. The boat 4 is moved upward by the transferring mechanism 6 by a predetermined distance and conveyed in a predetermined position in the reaction tube 1 not to contact the inner wall of the reaction tube 1. At this time, when the cover plate 9 is brought into contact with the manifold 8 arranged on the lower end of the reaction tube 1, the wafers 3 stacked on the boat 4 are automatically positioned, and the inside of the reaction tube 1 becomes airtight.

The reaction tube 1 is evacuated by a vacuum pump (not shown). While this evacuation is controlled to have a low pressure of, e.g., 0.1 to 3 Torr, and the reaction tube 1 is heated by the heater 17 to a predetermined temperature of, e.g., 400° to 1,400° C. While evacuation is controlled, a reactive gas such as silane ($SiH_4$) and an oxygen gas ($O_2$) is supplied from the reactive gas supplying tube 12 through openings (not shown) to the reaction tube 1 for a predetermined time to control a flow rate of the reactive gas is controlled by a mass flow controller (not shown) from a gas source. The reactive gas flow upwardly and is exchaused through the gap 7 and the exhaust tube 11. As a result, an $SiO_2$ layer is formed on the surface of the wafer 3 according to the following reaction formula (1):

$$SiH_4 + O_2 \rightarrow SiO_2 + 2H_2 \qquad (1)$$

In order to form an Si layer on the surface of the wafer 3 in place of the $SiO_2$ layer, an Si layer is formed using an $SiH_2Cl_2$ gas and a hydrogen ($H_2$) gas as reactive gases according to the following reaction formula (2):

$$SiH_2Cl_2 + H_2 \rightarrow Si + 2HCl \qquad (2)$$

As shown in reaction formula (2), when the Si layer is to be formed, HCl having a strong oxidizing power is produced. In an apparatus according to the present invention, however, since portions in the reaction tube 1 contacting the reactive gas are made of a corrosion-resistive material such as a non-metallic material such as quartz glass or ceramic, even when the HCl is produced, corrosion does not occur. Therefore, dust produced by the corrosion is not produced, thereby preventing the reaction tube 1 and the wafer 3 from contamination.

Since it can be suppressed that heavy metals such as Fe or the like are produced due to a high temperature of the reaction tube 1, contamination of the wafer by the heavy metals can be prevented.

After a deposition process is finished, supply of the reactive gas is stopped, and an inert gas such as an $N_2$ gas is supplied from the inert gas supplying tube 13 to return the pressure of the reaction tube 1 into an atmospheric pressure. The boat 4 on which the processed wafers 3 are stacked is conveyed to the transferring position 5. Thus, a CVD process is completed.

When the above CVD process is repeatedly performed, reaction products are attached to the tube walls of the reaction tube 1 and the inner tube 1a. The reaction products can be removed in the following etching. That is, a pair of electrodes are arranged outside the reaction tube 1, and an etching gas is supplied to the reaction tube 1. A high-frequency power is applied to the electrodes to generate a plasma discharge, and etching is performed by the gas plasma. In this case, since all the surfaces exposed to the inside of the reaction tube 1 are made of a non-metallic material, sputtering by the plasma is not performed. Therefore, dust is not produced. In order to prevent this sputtering, it is preferable that the non-metallic material has a low conductivity.

In the above embodiment, the reaction tube, the inner tube, and the like are made of quartz glass. However the present invention is not limited to the embodiment, and these parts may be made of any materials having resistance to corrosion. For example, the parts can be made of SiC or the like. In addition, in the above embodiment, the present invention is employed to a CVD apparatus. However, the present invention is not limited to the embodiment. For example, the present invention can be employed to an oxidation/diffusion apparatus, an etching apparatus, an ashing apparatus, or the like to obtain the same effect as in the above embodiment.

As described above, according to the present invention, since all the portions exposed to the reacting tube are made of a non-metallic material, corrosion of the apparatus due to a reaction gas can be prevented, thereby preventing an object to be treated in the reaction tube from contamination.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A corrosion resistant thermal treating apparatus for treating an object with a corrosive gas, which comprises:
    a reaction tube having an opening end and storing the object to be treated;
    heating means for heating the object to be treated;
    annular manifold means arranged at said opening end and having inlet means for supplying the corrosive gas to said reaction tube and outlet means for exhausting the corrosive gas from said reaction tube,
    cover means arranged at an opening end of said manifold means;
    an insulating cylinder arranged in the reaction tube to prevent downward conduction of heat from the reaction tube; and
    an insulating cylinder supporting member made of a non-metallic insulating material and disposed on the lower surface of the insulating cylinder.

2. An apparatus according to claim 1, wherein said non-metallic insulating material is a ceramic material.

3. An apparatus according to claim 2, wherein the ceramic material is a material selected from the group consisting of alumina, magnesia, spinel ($Al_2O_3$ MgO), silica, SiC, $Si_3N_4$, and amorpous silicon.

4. An apparatus according to claim 2, wherein the ceramic material is a material selected from the group consisting of alumina, magnesia, and spinel ($Al_2O_3$ MgO) which are formed by flame spraying.

5. An apparatus according to claim 1, wherein said annular manifold means and the cover means are made of a metal.

6. An apparatus according to claim 5, wherein the metal is stainless steel.

7. An apparatus according to claim 1, wherein an inner tube is concentrically arranged in said reaction tube.

8. An apparatus according to claim 1, wherein said insulating cylinder for preventing a decrease in temperature in said reaction tube is arranged near said annular manifold means in said reaction tube.

9. An apparatus according to claim 1, wherein an axis of said reaction tube vertically extends.

10. An apparatus according to claim 1, wherein said thermal treating apparatus is an apparatus selected from the group consisting of a CVD apparatus, an etching apparatus, an ashing apparatus, and an oxidation/ diffusion apparatus.

* * * * *